United States Patent
Spencer

(10) Patent No.: US 10,519,752 B2
(45) Date of Patent: Dec. 31, 2019

(54) SYSTEM, METHOD, AND APPARATUS FOR OPTIMIZED TOOLFACE CONTROL IN DIRECTIONAL DRILLING OF SUBTERRANEAN FORMATIONS

(71) Applicant: Baker Hughes, a GE company, LLC, Houston, TX (US)

(72) Inventor: Reed W. Spencer, Spring, TX (US)

(73) Assignee: Baker Hughes, a GE Company, LLC, Houston, TX (US)

( * ) Notice: Subject to any disclaimer, the term of this patent is extended or adjusted under 35 U.S.C. 154(b) by 330 days.

(21) Appl. No.: 15/629,378

(22) Filed: Jun. 21, 2017

(65) Prior Publication Data

US 2018/0148998 A1 May 31, 2018

Related U.S. Application Data

(60) Provisional application No. 62/427,321, filed on Nov. 29, 2016.

(51) Int. Cl.
*E21B 7/06* (2006.01)
*E21B 41/00* (2006.01)
(Continued)

(52) U.S. Cl.
CPC ............ *E21B 41/0092* (2013.01); *E21B 7/04* (2013.01); *E21B 7/06* (2013.01); *E21B 10/42* (2013.01);
(Continued)

(58) Field of Classification Search
CPC . E21B 7/06; E21B 10/42; E21B 47/18; E21B 44/00; E21B 10/00; E21B 7/00;
(Continued)

(56) References Cited

U.S. PATENT DOCUMENTS

2005/0096847 A1 5/2005 Huang
2006/0167668 A1* 7/2006 Cariveau ................. E21B 10/00
703/7
(Continued)

FOREIGN PATENT DOCUMENTS

WO 2012173601 A1 12/2012

OTHER PUBLICATIONS

Karadzhova, Gergana Nikolova, Master's Thesis, Drilling Efficiency and Stability Comparison Between Kymera, Tricone and PDC Bits, University of Stavanger, Faculty of Science and Technology, Jun. 16, 2014, 67 pages.
(Continued)

*Primary Examiner* — Kandasamy Thangavelu
(74) *Attorney, Agent, or Firm* — TraskBritt

(57) ABSTRACT

Systems, methods and apparatuses to aid with directional drilling through a subterranean formation are described. A model is provided that is indicative of: (i) one or more frictional forces at one or more contact points of the BHA and a wall of a non-linear borehole through a subterranean formation, (ii) one or more internal torques of the BHA between the one or more contact points, and (iii) one or more internal torques of the drill string between the one or more contact points. Based on the model, a toolface severity is determined for the drilling system, the toolface severity corresponding to a change in angular deflection for a change in applied weight-on-bit (WOB) of the BHA. A design is selected for the drilling system based on a comparison of the toolface severity to another toolface severity for a different design. Drilling may be performed by a drilling system having a bottom-hole assembly (BHA) optimized to reduce fluctuations in toolface orientation along a non-linear borehole.

20 Claims, 16 Drawing Sheets

(51) Int. Cl.
    *E21B 47/18*    (2012.01)
    *E21B 10/42*    (2006.01)
    *G06F 17/50*    (2006.01)
    *E21B 7/04*     (2006.01)
    *E21B 44/00*    (2006.01)
(52) U.S. Cl.
    CPC .............. *E21B 44/00* (2013.01); *E21B 47/18* (2013.01); *G06F 17/5009* (2013.01)
(58) Field of Classification Search
    CPC .......... E21B 47/16; E21B 47/01; E21B 47/06; G06F 17/5009; G06F 17/5086
    See application file for complete search history.

(56) References Cited

U.S. PATENT DOCUMENTS

| | | | |
|---|---|---|---|
| 2009/0065258 A1 | 3/2009 | Hamilton | |
| 2013/0032401 A1* | 2/2013 | Edbury | E21B 7/06 175/24 |
| 2013/0090855 A1* | 4/2013 | Rasmus | E21B 47/06 702/9 |
| 2013/0313021 A1* | 11/2013 | Zahradnik | E21B 7/00 175/57 |
| 2015/0012253 A1* | 1/2015 | O'Donnell | G06F 17/5009 703/2 |
| 2015/0142403 A1 | 5/2015 | Spencer et al. | |
| 2015/0142406 A1 | 5/2015 | Spencer et al. | |
| 2016/0069182 A1* | 3/2016 | Neale | E21B 47/16 166/254.2 |
| 2016/0194946 A1* | 7/2016 | Dykstra | E21B 44/00 175/24 |
| 2016/0237753 A1* | 8/2016 | Crawford | E21B 47/01 |
| 2016/0290055 A1* | 10/2016 | Anderle | G06F 17/5086 |
| 2016/0362972 A1* | 12/2016 | Dykstra | E21B 47/18 |
| 2017/0058613 A1* | 3/2017 | Ling | E21B 10/42 |

OTHER PUBLICATIONS

International Search Report for International Application No. PCT/US2017/062745 dated Feb. 14, 2018, 6 pages.
International Written Opinion for International Application No. PCT/US2017/062745 dated Feb. 14, 2018, 12 pages.

* cited by examiner

| Row | Depth ft | Distance ft | Length ft | Diameter in | Inclination ° | Azimuth ° | DLS °/100ft | Build Rate °/100ft | Walk Rate °/100ft | Friction Coefficient | Stiffness klbf/in | Comments |
|---|---|---|---|---|---|---|---|---|---|---|---|---|
| 1 | 0.00 | 4,500.00 | 2,064.00 | 8.90 | 1.00 | 0.00 | 0.1 | 0.0 | 8.5 | 0.0000 | 5.71e04 | |
| 2 | 2,064.00 | 2,436.00 | 1.00 | 8.90 | 1.87 | 176.14 | 3.8 | -2.5 | -90.2 | 0.0000 | 5.71e04 | |
| 3 | 2,065.00 | 2,435.00 | 1.00 | 9 | 1.84 | 175.24 | 4.2 | -3.9 | 41.5 | 0.0000 | 5.71e04 | |
| 4 | 2,066.00 | 2,434.00 | 1.00 | 9 | 1.80 | 175.65 | 7.1 | 6.4 | 94.8 | 0.0000 | 5.71e04 | |
| 5 | 2,067.00 | 2,433.00 | 1.00 | 9 | 1.87 | 176.60 | 4.1 | -2.5 | -103.1 | 0.0000 | 5.71e04 | |
| 6 | 2,068.00 | 2,432.00 | 1.00 | 9 | 1.84 | 175.57 | 9.2 | -7.9 | 149.1 | 0.0000 | 5.71e04 | |
| 7 | 2,069.00 | 2,431.00 | 1.00 | 9 | 1.86 | 177.06 | 7.5 | -4.8 | -188.7 | 0.0000 | 5.71e04 | |
| 8 | 2,070.00 | 2,430.00 | 1.00 | 9 | 1.71 | 175.17 | 5.0 | 4.1 | -97.5 | 0.0000 | 5.71e04 | |
| 9 | 2,071.00 | 2,429.00 | 1.00 | 9 | 1.75 | 174.20 | 10.0 | 8.8 | 152.0 | 0.0000 | 5.71e04 | |
| 10 | 2,072.00 | 2,428.00 | 1.00 | 9 | 1.84 | 175.72 | 4.4 | -1.7 | 126.7 | 0.0000 | 5.71e04 | |
| 11 | 2,073.00 | 2,427.00 | 1.00 | 9 | 1.83 | 176.98 | 3.5 | 2.6 | 72.9 | 0.0000 | 5.71e04 | |
| 12 | 2,074.00 | 2,426.00 | 1.00 | 9 | 1.85 | 177.71 | 6.8 | -6.4 | 65.6 | 0.0000 | 5.71e04 | |
| 13 | 2,075.00 | 2,425.00 | 1.00 | 9 | 1.79 | 178.37 | 9.0 | 7.9 | -137.4 | 0.0000 | 5.71e04 | |
| 15 | 2,076.00 | 2,424.00 | 1.00 | 9 | 1.87 | 177.00 | 4.6 | -4.0 | 73.6 | 0.0000 | 5.71e04 | |

*FIGURE 8A*

| Row | Name | Length ft | Distance ft | OD in | ID in | Gauge OD in | Bending Moment Limits Rotating klbf-ft | Bending Moment Limits Sliding klbf-ft | Bottom Connector Type | Bottom Connector Threads | Top Connector Type | Top Connector Threads | Comments |
|---|---|---|---|---|---|---|---|---|---|---|---|---|---|
| 1 | Bit | 1.00 | 1.00 | 6.000 | 2.000 | 8.750 | 5.00 | 10.00 | | | | | |
| 2 | 6-5 Ultra X-treme int stab (m1X-P) | 23.11 | 24.11 | 6.732 | 1.531 | 8.625 | 22.00 | 44.00 | | | | | |
| 3 | 6-75 Stop Sub | 1.64 | 25.75 | 6.795 | 2.283 | 6.795 | 22.13 | 44.25 | | | | | Bottom or Top stop sub |
| 4 | 6-75 CoPilot2 | 7.08 | 32.83 | 7.276 | 1.744 | 7.276 | 36.88 | 73.76 | | | | | |
| 5 | 6-75 BCPM1 | 10.63 | 43.46 | 7.252 | 2.165 | 7.252 | 36.88 | 73.76 | | | | | |
| 6 | 6-75 Stop Sub | 1.64 | 45.10 | 7.795 | 2.283 | 6.795 | 22.13 | 44.25 | | | | | Bottom or Top stop sub |
| 7 | 5" GrantP. HW95, XD90(TM) | 31.00 | 76.10 | 6.625 | 3.000 | 6.625 | 22.13 | 44.25 | | | | | |
| 8 | 8" GrantP. HW95, XD90(TM) | 31.00 | 107.10 | 6.625 | 3.000 | 6.625 | 22.13 | 44.25 | | | | | |
| 9 | 3" pipe | 5,555.00 | 5,662.10 | 3.000 | 1.500 | 3.000 | 11.00 | 22.00 | | | | | |

Bit Depth 4,500.00 ft    Orientation 0.00 °

*FIGURE 8B*

SYSTEM, METHOD, AND APPARATUS FOR OPTIMIZED TOOLFACE CONTROL IN DIRECTIONAL DRILLING OF SUBTERRANEAN FORMATIONS

CROSS-REFERENCE TO RELATED APPLICATIONS

This application claims the benefit of U.S. Provisional Patent Application Ser. No. 62/427,321, filed Nov. 29, 2016, the contents and disclosure of which is hereby incorporated by reference in its entirety.

TECHNICAL FIELD

Embodiments of the present disclosure relate to toolface control in a non-linear (such as directional) drilling of subterranean formations. Some embodiments relate to techniques for computer-aided modeling of a toolface response to a drilling system at various weight-on-bit values, and other embodiments relate to systems and methods that incorporate such techniques to optimize toolface control.

BACKGROUND

Many directional drilling systems use bent motors (such as a Bent Motor AKO System) to drill along a curved or non-linear path. Users steer such systems by, among other things, controlling the toolface direction of the drill bit at a distal end of a bottom-hole assembly (BHA).

Drillers at a rig monitor and respond to changes in the toolface orientation during directional drilling with a bent motor because torque on the drill string can cause the drilling system to veer off the intended drilling path. Drillers typically adjust weight-on-bit (WOB) via a brake to control rate of penetration (ROP) and torque on the drill string. Increasing WOB generally leads to increased ROP, but can also result in loss of toolface control and, hence, result in a trajectory of the BHA that does not follow the intended drilling path. Thus, the driller may be required to periodically pause drilling and reorient the BHA to maintain the intended drilling trajectory.

Drillers commonly rely on their experience with a given BHA to estimate the maximum WOB that may be applied so as to maximize ROP while maintaining toolface control. If a driller is not familiar with a drill bit or BHA, the drill path, or the formation material or materials being drilled through, then the ability to drill efficiently and accurately along an intended path may be severely impaired. Moreover, if a driller selects an aggressive drill bit and underestimates the effect of the bit on toolface control, then the WOB used to maintain toolface control may slow down a drilling operation, decrease utilization efficiency, and generally increase costs while reducing profitability. Other problems and drawbacks may also exist in the prior art.

Accordingly, tools are needed that assist with overcoming the limitations and drawbacks described above.

BRIEF SUMMARY

Aspects and advantages of the present disclosure will be apparent to one of ordinary skill in the art from the following summary in conjunction with the appended Figures and detailed description:

One or more embodiments of the disclosure comprise computer-implemented methods of designing a drilling system that has a bottom-hole assembly (BHA) and drill string. One or more embodiments of such methods comprise providing a model. The model may be indicative of: (i) one or more frictional forces at one or more contact points of the BHA and a wall of a non-linear borehole through a subterranean formation, (ii) one or more internal torques of the BHA between the one or more contact points, and (iii) one or more internal torques of the drill string between the one or more contact points. Based on the model, a toolface severity for the drilling system may be determined. The toolface severity may correspond to a change in angular deflection for a change in applied weight-on-bit (WOB) of the BHA. A design for the drilling system may be selected based on a comparison of the toolface severity to another toolface severity for a different design.

Other embodiments comprise methods of directional drilling through a subterranean formation. One or more embodiments of such methods may comprise drilling with drilling system having a bottom-hole assembly (BHA) optimized to reduce fluctuations in toolface orientation along a non-linear borehole. The optimization to reduce fluctuations in toolface orientation along a non-linear borehole may be based on one or more predictions for a rate of penetration, a weight-on-bit, and an angular deflection.

Other embodiments comprise computer program products for enabling a computer to assist with designing a drilling system. One or more embodiments of the program product may comprise a non-transitory computer-readable medium. Instructions on the transitory computer-readable medium may be adapted to enable the computer to perform certain operations. The operations may include providing a model. The model may be indicative of: (i) one or more frictional forces at one or more contact points of the BHA and a wall of a non-linear borehole through a subterranean formation, (ii) one or more internal torques of the BHA between the one or more contact points, and (iii) one or more internal torques of the drill string between the one or more contact points. The operations may further include determining, based on the model, a toolface severity for the drilling system, the toolface severity corresponding to a change in angular deflection for a change in applied weight-on-bit (WOB) of the BHA. The operations may further include selecting a design for the drilling system based on a comparison of the toolface severity to another toolface severity for a different design.

Other embodiments comprise systems for enabling toolface control while drilling a borehole through subterranean formation. One or more embodiments of the systems may comprise a computer model and a drilling system. The computer model may be indicative of differences in toolface control for a plurality of drill bits. The drilling system may include a first drill bit that according to the computer model has a higher toolface control than at least one other drill bit of the plurality of drill bits.

The foregoing and other features and advantages of the embodiments of the disclosure will be made more apparent from the descriptions, drawings and claims that follow.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following figures form part of the present specification and are included to further illustrate features and aspects of the disclosed embodiments. The disclosed embodiments may be better understood by reference to one or more of these figures in combination with the detailed description of each specific embodiment that follows.

FIGS. 8A through 8C illustrate various graphical user-interfaces for facilitating computer-aided design and optimization of a drilling system and drilling operations.

DETAILED DESCRIPTION

Figure 1:
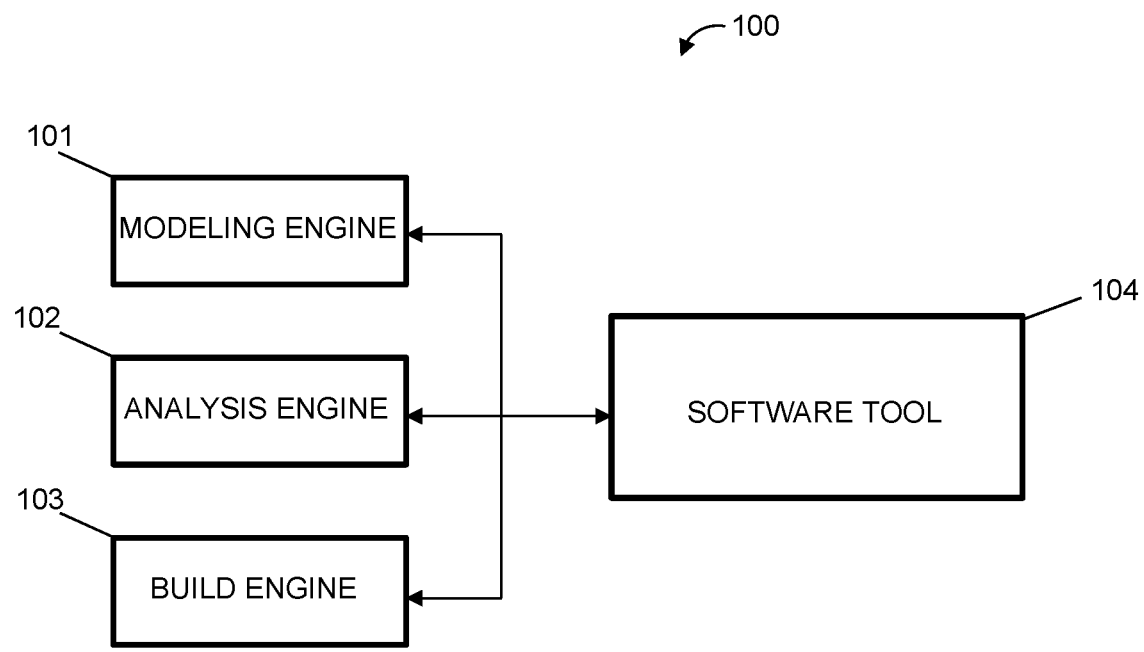
FIG. 1 illustrates a computer system for computer-aided design and computer-aided drilling operations according to an embodiment of the disclosure.

Various embodiments of the disclosure relate to computer-aided modeling of drilling performance. A "computer system," as such term is used herein, includes at least one non-transitory computer-readable memory and at least one processor. In general, the memory will store, at one time or another, at least portions of an executable program code, and the processor will execute one or more of the instructions included in that executable program code. It will be appreciated that the term "executable program code" and the term "software" mean substantially the same thing for the purposes of this description. It is not necessary that the memory and the processor be physically located in the same place. The processor and the memory may be distributed among physical pieces of equipment or even in geographically distinct locations.

The processor may be a general purpose "central processing unit," but may utilize a wide variety of other technologies and specific purpose hardware may be used to implement the embodiments of the disclosure, including a microcomputer, mini-computer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID integrated circuits, smart chip, or any other device or arrangement of devices that is capable of implementing the steps of the processes of the disclosure. The processor may consist of a single core, or may be a multi-core processor that has two or more processing units that can operate executing instructions independently in parallel.

Various embodiments of the disclosure may be described in terms of "module(s)" and "engine(s)," which refer to the logic, embodied in hardware and/or software, to accomplish the features, functions, tasks or steps described herein. In the case of a general purpose computer, the "modules" and "engines" may be embodied in software classes and applications executed by processor cores, and while the modules or engines are executing, the general purpose computer may be thought of as a special purpose computer or a specific purpose computer. The "modules" and "engines" may also relate to a specific purpose hardware including the firmware and machine code controlling its operation.

Further, when embodied in software, the "modules" and "engines" that enable a computer system to act in accordance with embodiments of the disclosure may be provided in any number of language forms including, but not limited to, original source code, assembly code, object code, machine language, compressed or encrypted versions of the foregoing, and any and all equivalents. Some examples of languages that may be used to write the software include, but are not limited to, C, C++, JAVA®, MATLAB®, MINITAB®, EXPRESS, DRAKON, DYNA®, PYTHON, and RUBY. The software programs may be further translated into machine language or virtual machine instructions and stored in a program file in that form. The program file may then be stored on or in one or more of the articles of manufacture.

Users may interact with the computer systems described herein by way of graphical user-interfaces (GUIs) on a display and input devices such as touchscreens, keyboards, a computer mouse, touchpads, and the like.

FIG. 1 illustrates a computer system 100 that includes a modeling engine 101, analysis engine 102, build engine 103, and a software tool 104. The modeling engine 101, analysis engine 102 and build engine 103, are configured to assist with computer implemented simulation, optimization and design, of a drilling system, according to an embodiment of the disclosure. The software tool 104 is configured to facilitate CAD software and optimization of a drilling system in conjunction with the modeling engine 101, analysis engine 102, and build engine 103. Though the modeling engine 101, analysis engine 102, build engine 103, and software tool 104 are illustrated as separate modules within the computer system 100, the modeling engine 101, analysis engine 102, and build engine 103 may be incorporated into the software tool 104, for example, as a library or libraries for performing the analysis described below.

In one embodiment of the disclosure, the computer system 100 is configured for simulation and design as described in U.S. Patent Application Publication No. 2015/0142406, by R. Spencer, entitled "DIRECTIONAL DRILL AHEAD SIMULATOR: DIRECTIONAL WELLBORE PREDICTION USING BHA AND BIT MODELS," published May 21, 2015, the entire contents and disclosure of which is hereby incorporated by this reference.

Embodiments of the modeling engine 101 are configured to perform calculations to model, among other things, aspects of toolface orientation of a drilling system. In one embodiment the modeling engine 101 utilizes finite element (FE) type components to model a drilling system, including the BHA, drill string, and borehole through a formation. FE network components may be obtained using a CAD software package. Non-limiting examples of CAD software packages includes Solid Works, ProEngineer, AutoCAD, and CATIA.

Various embodiments of the models may be three-dimensional or wo-dimensional. The models may include, for example, geometrical properties as well as material properties such as density, stiffness, tensile strength, and other properties relevant toolface orientation of a drilling system, including those described herein.

The modeling engine 101 may be configured to accept one or more inputs related to modeling a drilling system, including parameters and importing models of the material to be drilled, the drill bit and other components of the BHA and drill string, as well as the toolface. Each such model may include or facilitate modeling of the frictional forces for the modeled item.

Embodiments of the analysis engine 102 are configured to perform calculations and analyze models of drilling system, including performance during directional drilling. In some embodiments, the analysis engine 102 may include packages for FE analysis of the FE components, including the manner of analysis described herein. By way of non-limiting example, types of analysis may include calculation of frictional forces, internal forces, and response to forces (e.g., toolface orientation and deflection), and the like.

Embodiments of the build engine 103 are configured to build models and designs of drilling systems, including models and designs according to parameters selected based on the modeling and analysis performed by the modeling engine 101 and analysis engine 102. The build engine 103 may be configured to generate files and data sets relevant to designs.

Figure 2B:
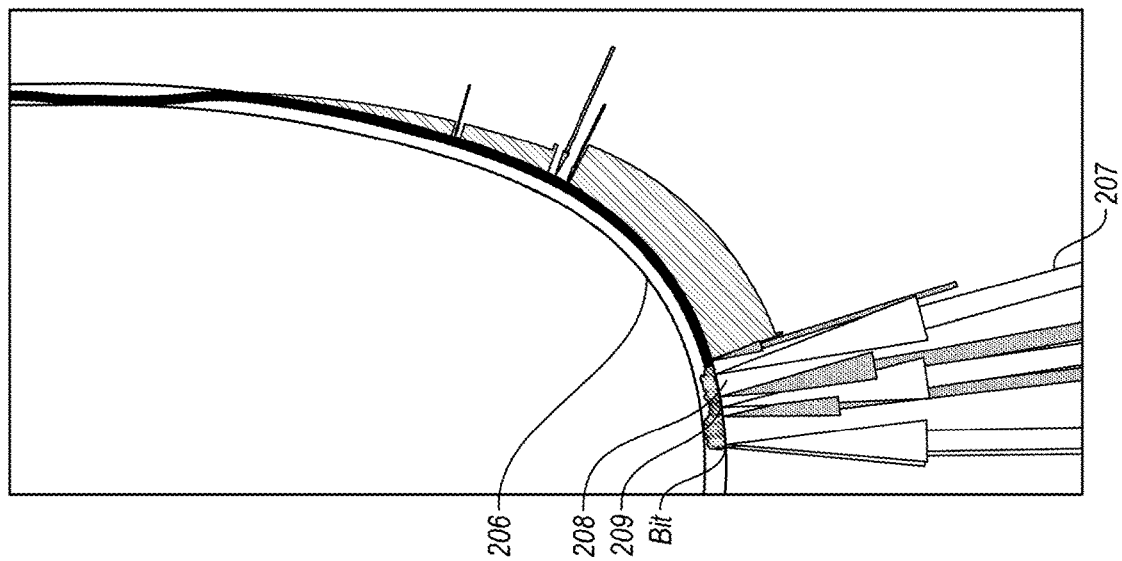
FIG. 2A and FIG. 2B illustrate a drilling system and a drill path for the drilling system that may be modeled and optimized according to an embodiment of the disclosure.
Figure 2A:
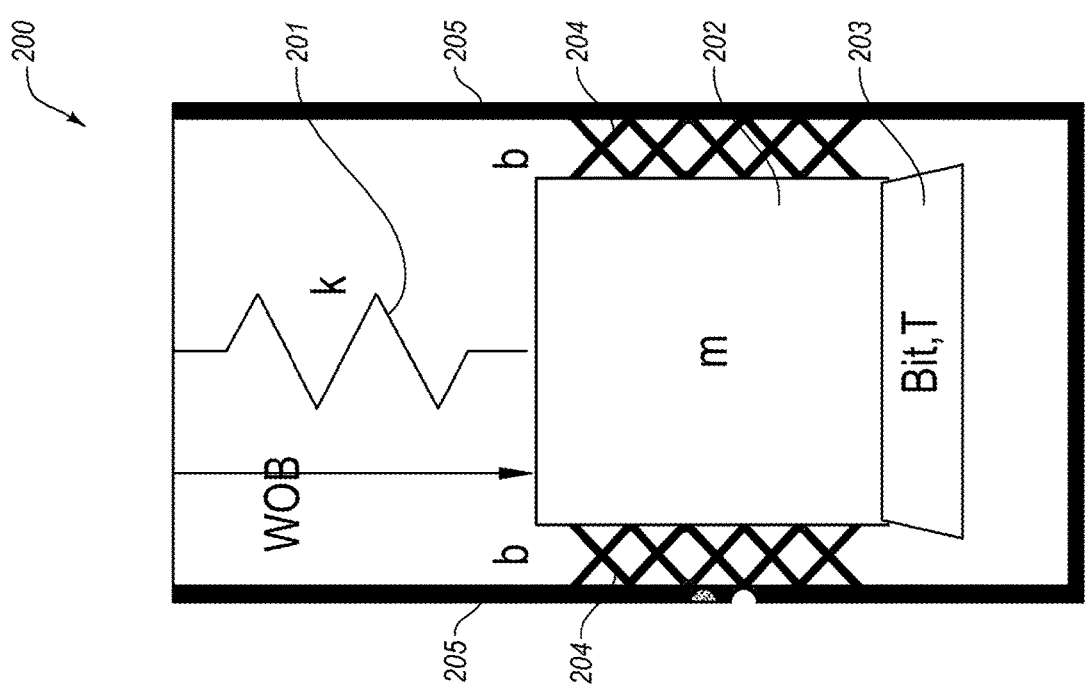

FIG. 2A illustrates a drilling system 200 that may be modeled and analyzed for a directional drilling operation illustrated in FIG. 2B, in accordance with an embodiment of the disclosure. Drilling system 200 includes a drill string 201, a bottom-hole-assembly (BHA) 202, and a drill bit 203. Also illustrated in FIG. 2A is a friction 204 between the BHA and the hole-wall 205.

For the drilling system 200, the drill string 201 has a stiffness "k," the BHA has a mass "m," the friction 204 is value "b," and the drill bit 203 produces a torque "T" for a given depth-of-cut (DOC) produced by WOB.

FIG. 2B illustrates a simulation of a borehole through a formation along a drill path 206 of a drilling system 200, according to an embodiment of the disclosure. Contact forces 207 act at contact points 209, and sections 208 of the drilling system reside between the contact points 209. As described below, in embodiments of the disclosure, forces are calculated at the contact points 209 and at the sections 208 between the contact points.

Figure 3:
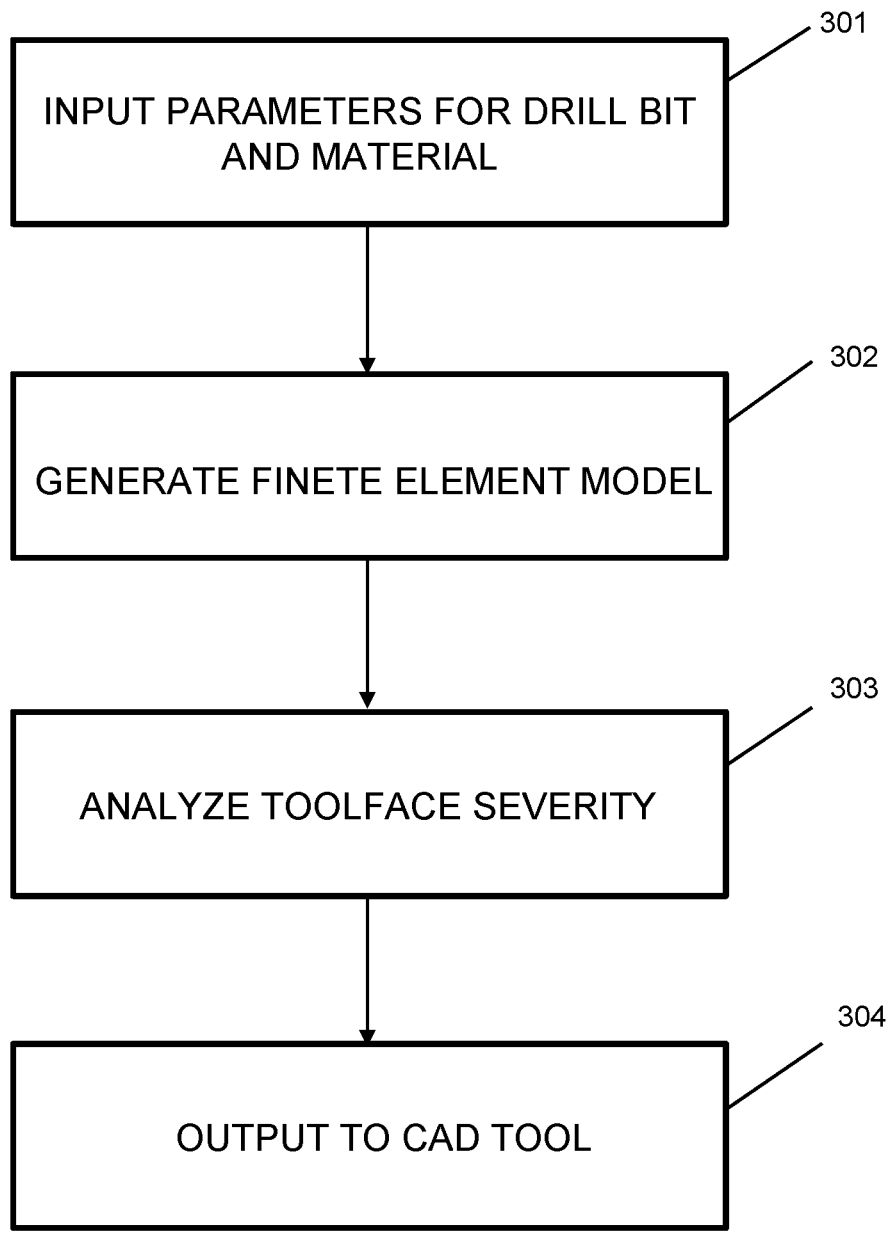
FIG. 3 is a flowchart of an operation for modeling and analyzing expected performance of a drilling operation according to an embodiment of the disclosure.

FIG. 3 illustrates modeling and analysis operations performed at the computer system 100, according to an embodiment of the disclosure. The computer system 100 receives, inputs or has input parameters for the drill bit 203, other components of the BHA 202, drill string 201, and the material in the wellbore to be drilled, in operation 301. In various embodiments a user may input the parameters or may import model files. By way of a non-limiting example, model files may be generated by ABAQUS® INP, ANSYS® ANS, or ANSYS® CDB. Specific model files for the model of the drill bit 203 may also be generated by a dual laterlog (DLL), a DIRECTIONAL DRILL AHEAD SIMULATOR (DDAS), PDC, or BD3 by IDS. Model files for the model of the drill string 201 may also be generated using NOV CTES ORPHEUS™.

In one embodiment, the model (or models) of the drill bit 203 and BHA 202 is an axial motion drill bit model of the type described in U.S. Patent Application Publication No. 2015/0142403 by R. Spencer, entitled "AXIAL MOTION DRILL BIT MODEL," published May 21, 2015, the entire contents and disclosure of which is hereby incorporated by this reference.

In various embodiments of the disclosure, the modeling engine 101 (FIG. 1) is configured to perform a mesh operation on the imported models or generate a new model based on input parameters, and generate an FE model for the drill bit, BHA, drill string, borehole and material, in operation 302. The generated FE model may be used to perform a toolface severity analysis as described herein.

In various embodiments of the disclosure, the analysis engine 102 is configured to use the generated FE model to determine a toolface severity of the drilling system 200, in operation 303.

The analysis engine 102 is configured to output the results of the analysis of toolface severity, in operation 304. The results may be output to the build engine 103, to the software tool 104, storage, or to an external system (not shown).

As already described herein, the computer system 100 may determine a toolface control and a toolface deflection associated with the drilling system 200 based on the determined toolface severity.

Figure 4A:
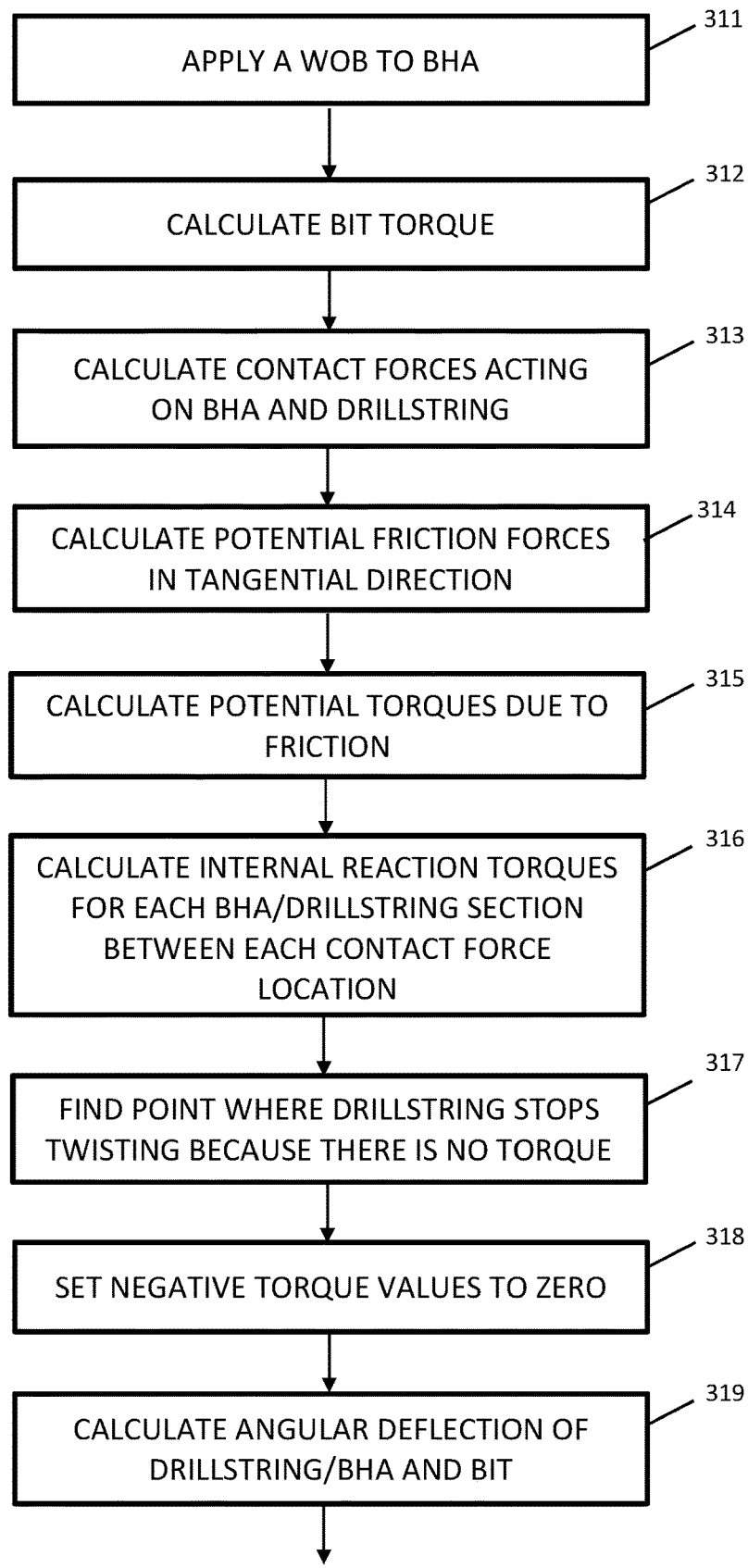
FIGS. 4A and 4B are flowcharts of an operation for modeling and analyzing expected toolface severity experienced by a drilling system according to an embodiment of the disclosure.
Figure 4B:
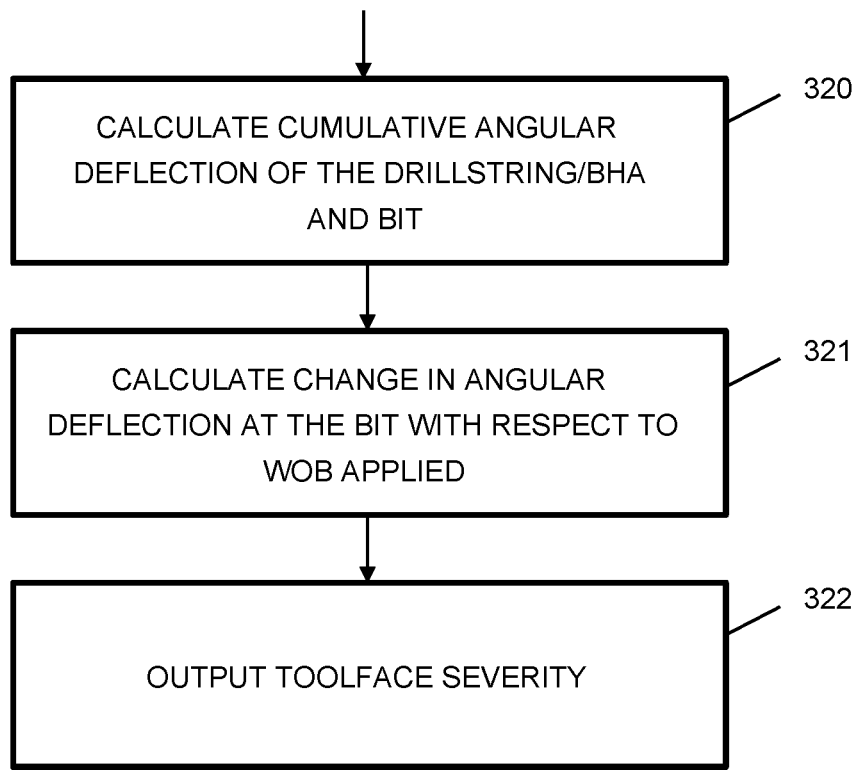

FIGS. 4A and 4B illustrate an example of an analysis of toolface severity for a drilling system 200 by the analysis engine 102 in accordance with an embodiment of the disclosure. First, WOB is applied to the BHA in operation 311. In one embodiment this may be WOB read at the surface. In another embodiment, the downhole WOB due to friction may be calculated while sliding (RIH or "run in hole" WOB) to account for force at the bit being less than the driller has specified due to drag.

In operation 312 the bit torque is calculated, for example, using a model such as the FE model. In one embodiment the bit torque is calculated using Eq. 1:

$$T_{bit} = \mu * WOB \quad \text{(Eq. 1)}$$

Where $\mu$=aggressiveness of the bit (also referred to as "Mu" herein). The aggressiveness of a bit may be determined by the depth of cut a bit is designed to remove. For example, n roller cone bits the aggressiveness maybe determined by the projection, pitch of the teeth and cone offset. For polycrystalline diamond compact (PDC) bits the aggressiveness may be determined by cutter exposure and cutter angle. In one embodiment, the aggressiveness of a bit may be calculated by Eq. 2:

$$\mu = \frac{36 \times \text{Torque}}{WOB \times \text{Diameter}} \quad \text{(Eq. 2)}$$

Typically, a higher Mu means that a drill bit can generate more torque with a lower WOB, but it can suffer from impact damage in abrasive formations. "Mu" is determined as a measurement for bit aggressiveness.

All of the contact forces at contact points 209 (see FIG. 2B) acting on the BHA 202 and the drill string 201 are calculated in operation 313. All of the potential friction forces in the tangential direction are calculated in operation 314. In one embodiment, the potential friction forces in the tangential direction are calculated using Eq. 3:

$$F_{friction} = F_{contact} * \mu_{wall\ friction} \quad \text{(Eq. 3)}$$

All of the potential torques due to friction are calculated in operation 315. In one embodiment, the potential torques due to friction are calculated using Eq. 4:

$$T_{friction} = F_{friction} * \text{Radius} \quad \text{(Eq. 4)}$$

Wherein, radius=the distance from the axis of rotation of the BHA or drill string component to the location on the surface of the BHA or drill string component at which the frictional force is applied.

In various embodiments of the disclosure, the terms "potential friction" and "potential torque" refer to the reactive tangential friction forces and torques that may take place. These frictions and torques are generated if torque generated at the bit is transmitted through the whole drill string. Friction nearer the bit may prevent torque from being transmitted to the drill string farther up the hole.

All of the internal reaction torques for each the section 208 (see FIG. 2B) of the drill string 201 and BHA 202 between each contact force location (i.e., the contact points 209 in FIG. 2B) are calculated in operation 316 and stored in a vector. In one embodiment, for each section the internal reaction torques may be calculated using Eq. 5:

$$T_{internal\ at\ point\ x} = T_{bit} - \Sigma T_{friction\ from\ bit\ to\ x} \quad \text{(Eq. 5)}$$

The point "x" where the internal reaction torque goes to zero is determined in operation 317 based on the internal reaction torques calculated in operation 316. The point in the drill string where the internal reaction torque goes to zero is the point when the drill string stops twisting because friction has robbed all of the torque. The drill string above that point just sits there. Because there is no torque, there is no torsional deflection of the toolface. Internal reaction torque values past the zero point will be negative. Once all the internal reaction torque values are calculated, all negative internal reaction torque values are set to zero in operation 318. The angular deflection of the drill string 201, BHA 202, and drill bit 203 is calculated in operation 319. In one embodiment, the angular deflection equation for each section is calculated using Eq. 6:

$$\theta_i = (T_{internal} * L)(G * J) \quad \text{(Eq. 6)}$$

Where: G=shear modulus of the drill string section
J=polar moment of inertia of the drill string section
L=length of the drill string section The cumulative angular deflection of the drill string 201, BHA 202, and drill bit 203 are calculated in operation 320. In one embodiment, the cumulative angular deflection for each section is calculated using Eq. 7, where n=1 to the number of sections:

$$\theta_n = \Sigma((T_{internal} * L)/(G * J)) \quad \text{(Eq. 7)}$$

The change in angular deflection, which is the change in toolface, at the drill bit 203 with respect to the applied WOB is calculated in operation 321. In one embodiment, the change in angular deflection is a function of the change in applied WOB, a parameter referred to herein as "Toolface Severity," is calculated using Eq. 8:

$$\text{Toolface Severity} = (\Delta\text{Toolface})/(\Delta\text{WOB}) = d(\text{TF})/d(\text{WOB}) = d(\theta_i)/d(\text{WOB}) \quad \text{(Eq. 8)}$$

The derivative may be found numerically using the WOB (input), the cumulative angular deflection data calculated in operation 320, and finite difference formulas.

The results of the calculation of the toolface severity by the analysis engine 102 may be output to a build engine 103 and/or a software tool 104, in operation 322. In some embodiments, the results may be displayed in a graphical form.

An embodiment of computer-aided design that utilizes toolface severity modeling like that performed by the computer system 100 will now be described with reference to FIGS. 5A to 5E.

Figure 5A:
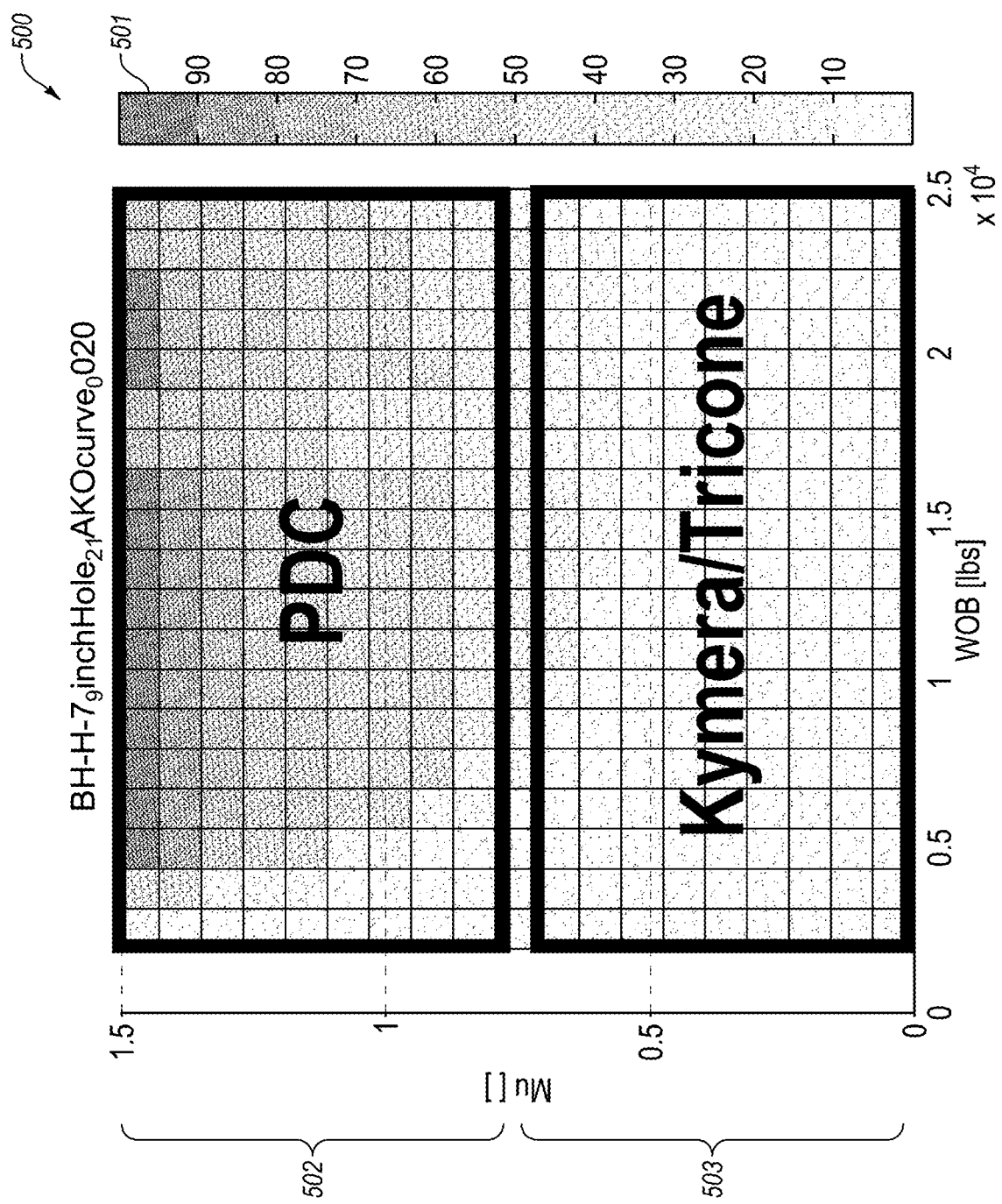
FIGS. 5A through 5E illustrate graphical models that incorporate toolface severity and are usable in computer-aided design and optimization of a drilling system and drilling operations.

FIG. 5A illustrates a graphical model 500 of toolface severity vs. aggressiveness vs. WOB for a drilling system modeled according to an embodiment of the disclosure. Bar 501 on the right side illustrates a measure of the toolface severity, with dark blocks having low toolface severity (e.g., 10) and lightly shaded blocks having a high toolface severity (e.g., 99). As may be seen in region 502, an aggressive bit/rock interaction ($\mu$=1.5), such as what may be exhibited when drilling with a PDC drag bit, may yield a +/−90° toolface fluctuation if the WOB fluctuates+/−1000 lb. As may be seen in region 503, a KYMERA® or a Tricone drill bit, under the same fluctuating WOB only exhibits toolface fluctuations of +/−10°. KYMERA® and Tricone drill bits are, respectively, hybrid (both rolling cutting structures and fixed cutting elements) and roller-type drill bits that do not experience the same aggressiveness as a PDC drag bit, and with a toolface fluctuation of +/10° provide good toolface control.

Figure 5B:
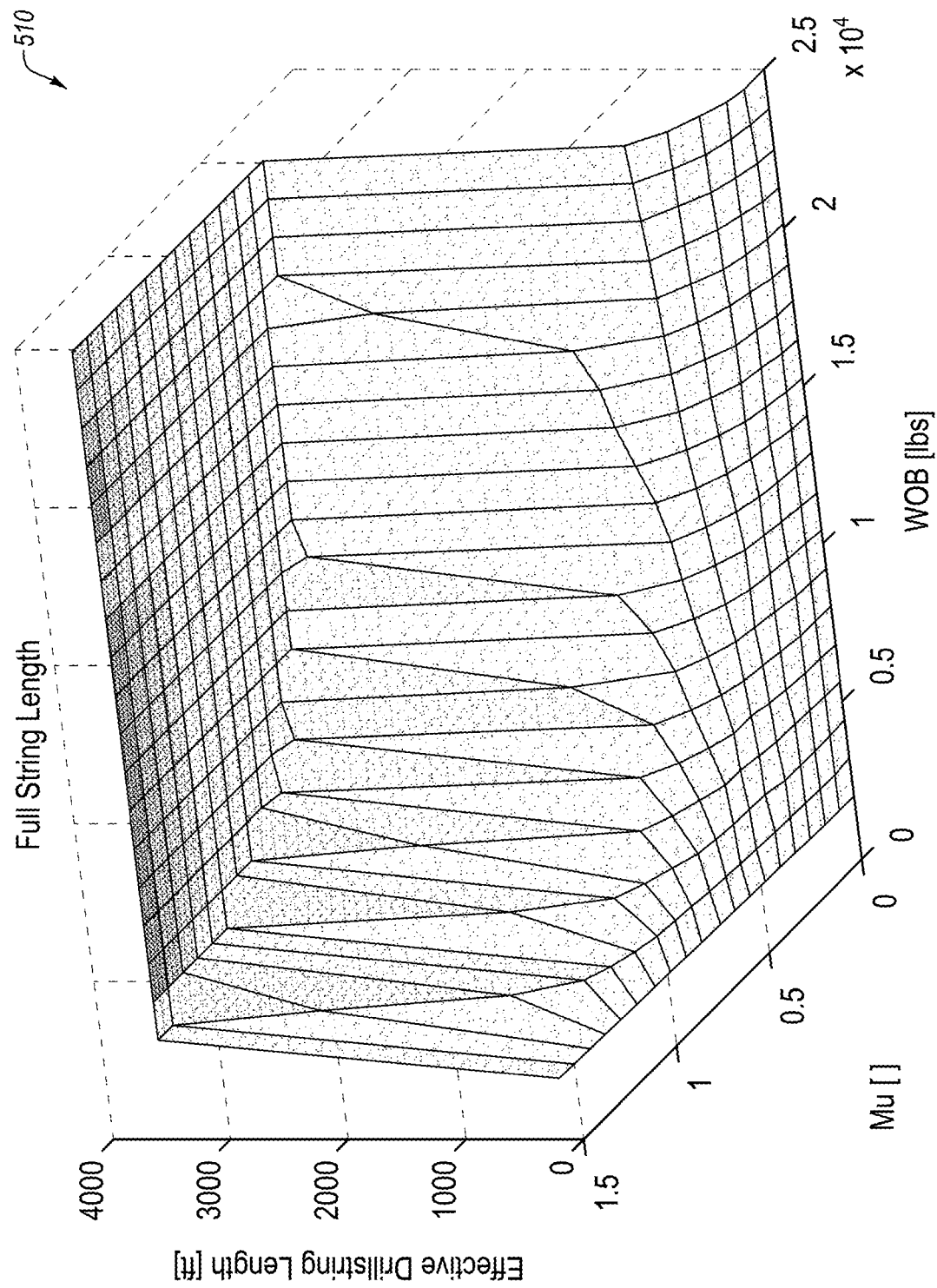

FIG. 5B illustrates a graphical model 510 of the effective drill string length vs. aggressiveness vs. WOB. The graphical model 510 utilizes the same scale to illustrate toolface severity as in Bar 501 of FIG. 5A. Among other things, graphical model 510 illustrates one of the causes of toolface deflection in a drilling system-frictional forces may cause portions of a drill string to twist relative to a BHA. The portion of the drill string that twists relative to the BHA acts like a spring and the twisting affects toolface control. The length of the portion of the drill string that twists relative to the BHA, and therefore acts like a spring is proportional to the toolface severity.

Graphical model 510 illustrates the effective drill string length, i.e., the portion of the drill string that twists when torque is applied at the bit. The modeled BHA happens to be in a curve of a borehole. Once enough torque is applied to overcome all the friction in the curve (which is about 500 feet long), the entire vertical portion can twist easily as well. The shorter the effective drill string length, the lower the toolface severity and better the toolface control.

Figure 5C:
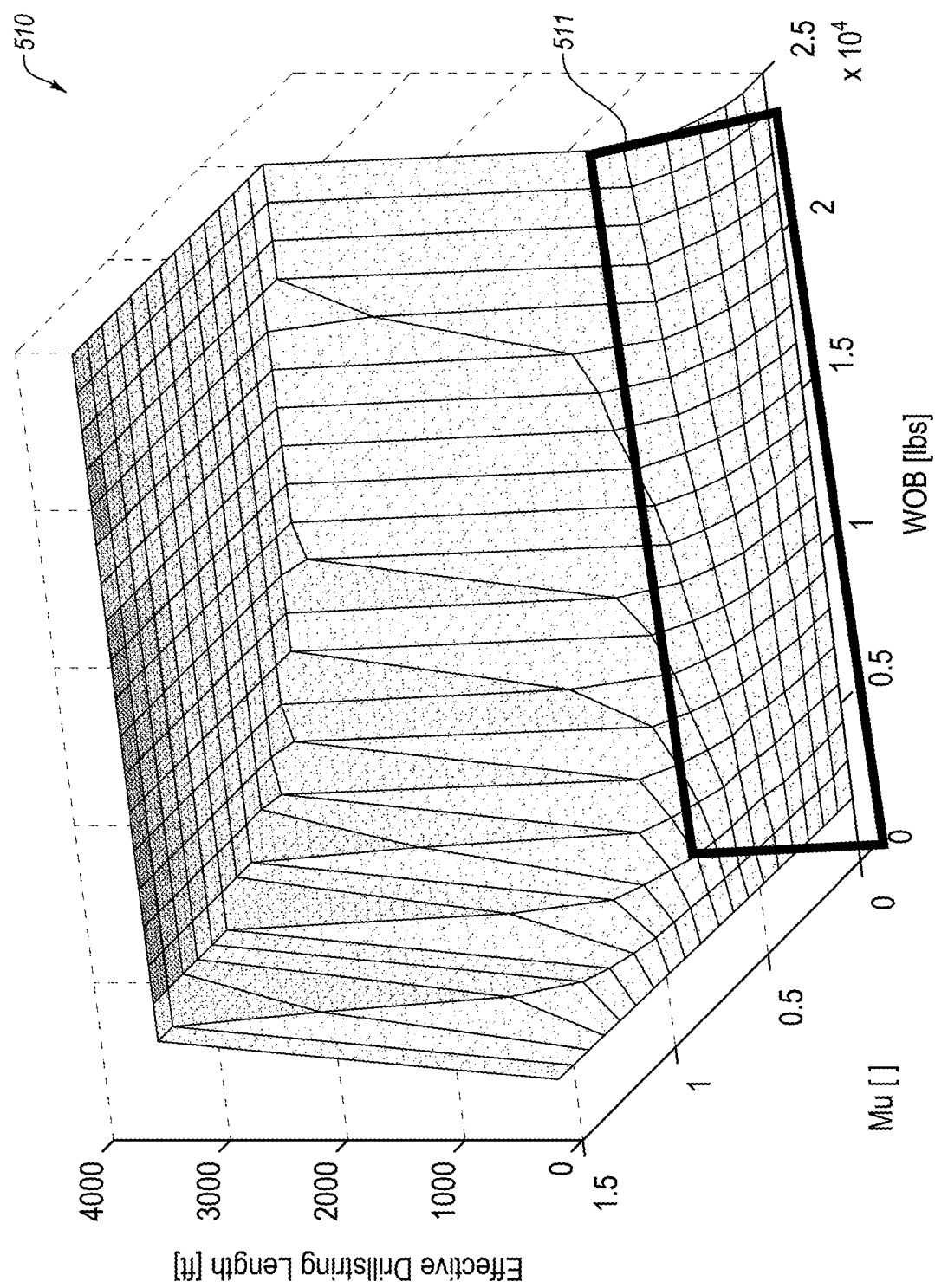

FIG. 5C illustrates the graphical model 510 in FIG. 5B, with a white box around a region 511 of the graph having aggressiveness <0.5. The portion of the drill string that is acting as a spring is short in this drill string, and this graph indicates very good toolface control.

Figure 5D:
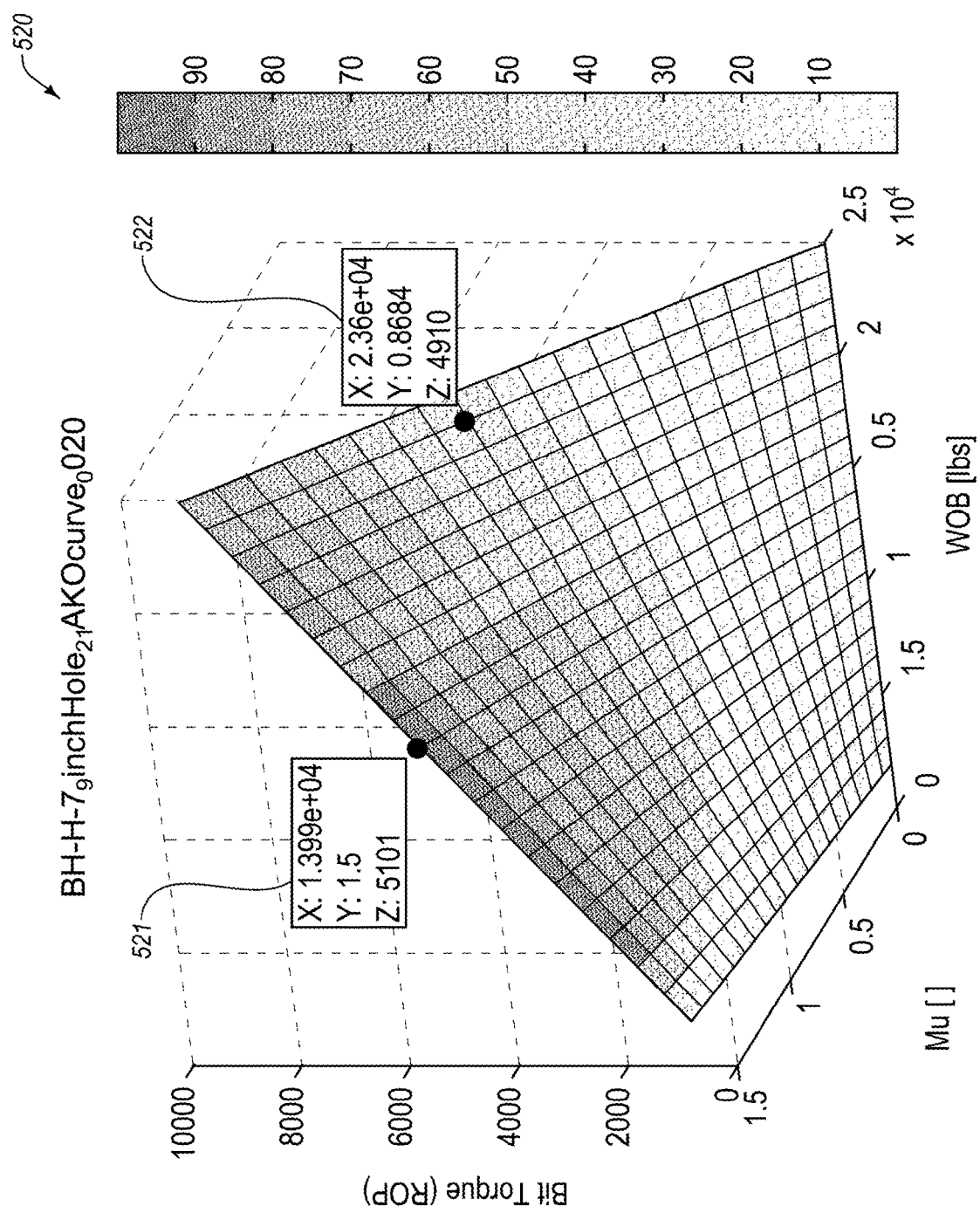

FIG. 5D illustrates a graphical model 520 of toolface severity superimposed on a WOB vs. aggressiveness vs. bit torque (which may be assumed to be linearly proportional to ROP) plot. The plot shows data points 521 and 522 for two bits, each with a different WOB. Both yield approximately the same instantaneous torque and ROP. The toolface severity will be approximately 50% lower on the bit 522 with the lower $\mu$ value ($\mu$=0.86), and hence improved toolface control is expected with such a bit. Accordingly, by comparing toolface severity, ROP, and WOB, an optimal drill bit may be identified and selected (by a user or automatically) with the aid of the software tool 104.

Figure 5E:
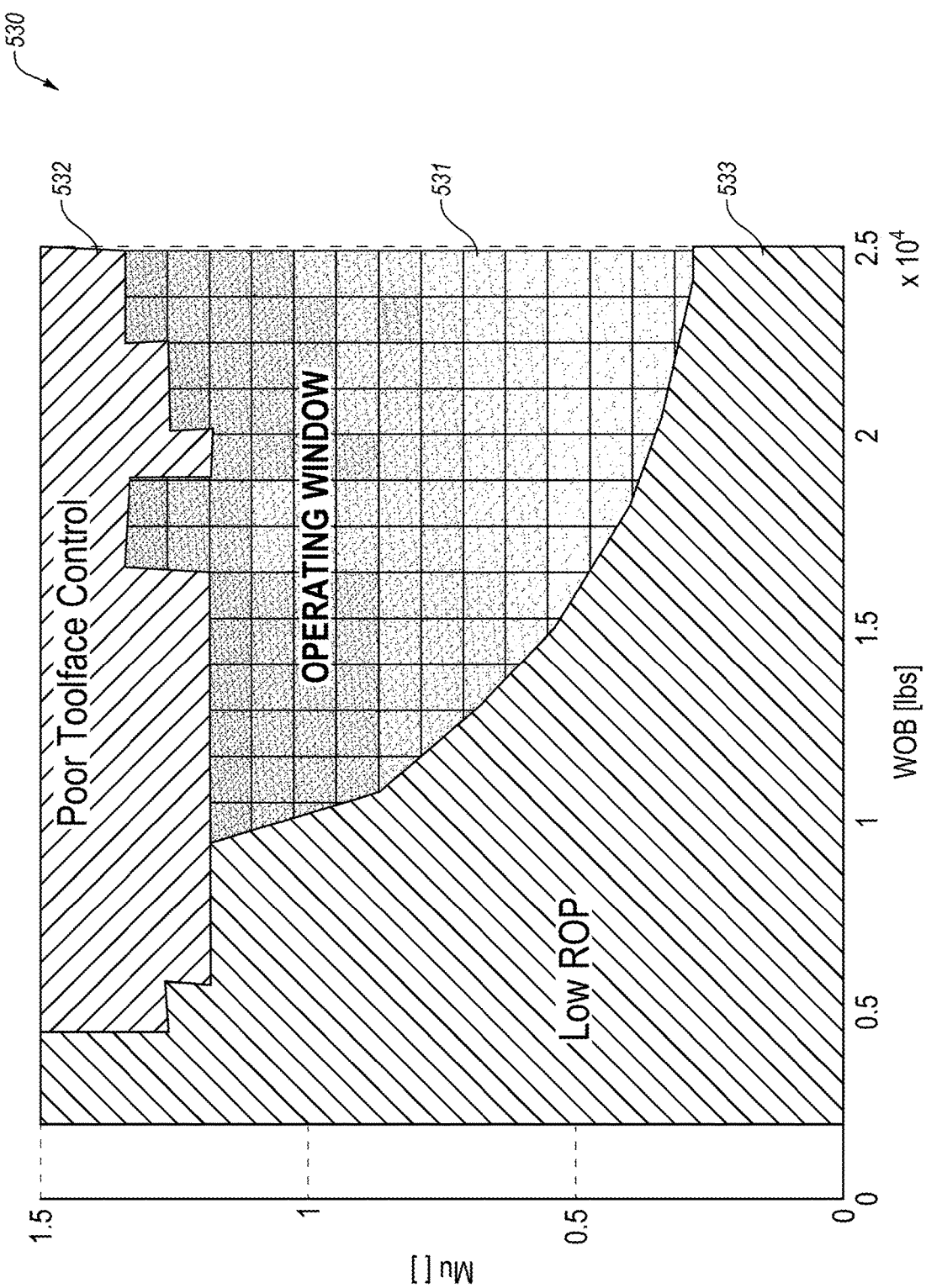

FIG. 5E illustrates a graphical model 530 of the operating window for a drilling system and that may be used to assist with optimizing the arrangement of a drilling system according to an embodiment of the disclosure. In graphical model 530, the black regions comprise a low ROP region 533 and a "poor" toolface control region 532. The remaining region, the operating window 531, is a non-limiting example of acceptable ROP and toolface control. The "operating window" represents the drilling operation using the selected drill bit. In some embodiments, design selection may be based on maximizing the operating window and/or identifying a desirable operating window. In other embodiments, design selection thresholds, for example, for ROP and toolface severity may be defined and analyzed compared to the models described herein.

Various embodiments described with reference to FIG. 1-5E may be implemented as an on-demand service, for example, software-as-a-service (SAAS), a public cloud-based service, and a private cloud based service, herein after referred to as "hosted service(s)". Such a hosted service may be implemented on one or more computer servers. One or more terminals may connect to the hosted service via a network, such as the Communications Network 620 illustrated in FIG. 6. By way of non-limiting example, the terminal may be a personal computer, server, laptop, tablet, mobile phone or similar device. In one embodiment, access to the hosted service may be provided via a web-browser. The hosted service may be configured to receive parameters related to one or more services, perform the service and then generate one or more results.

Figure 6:
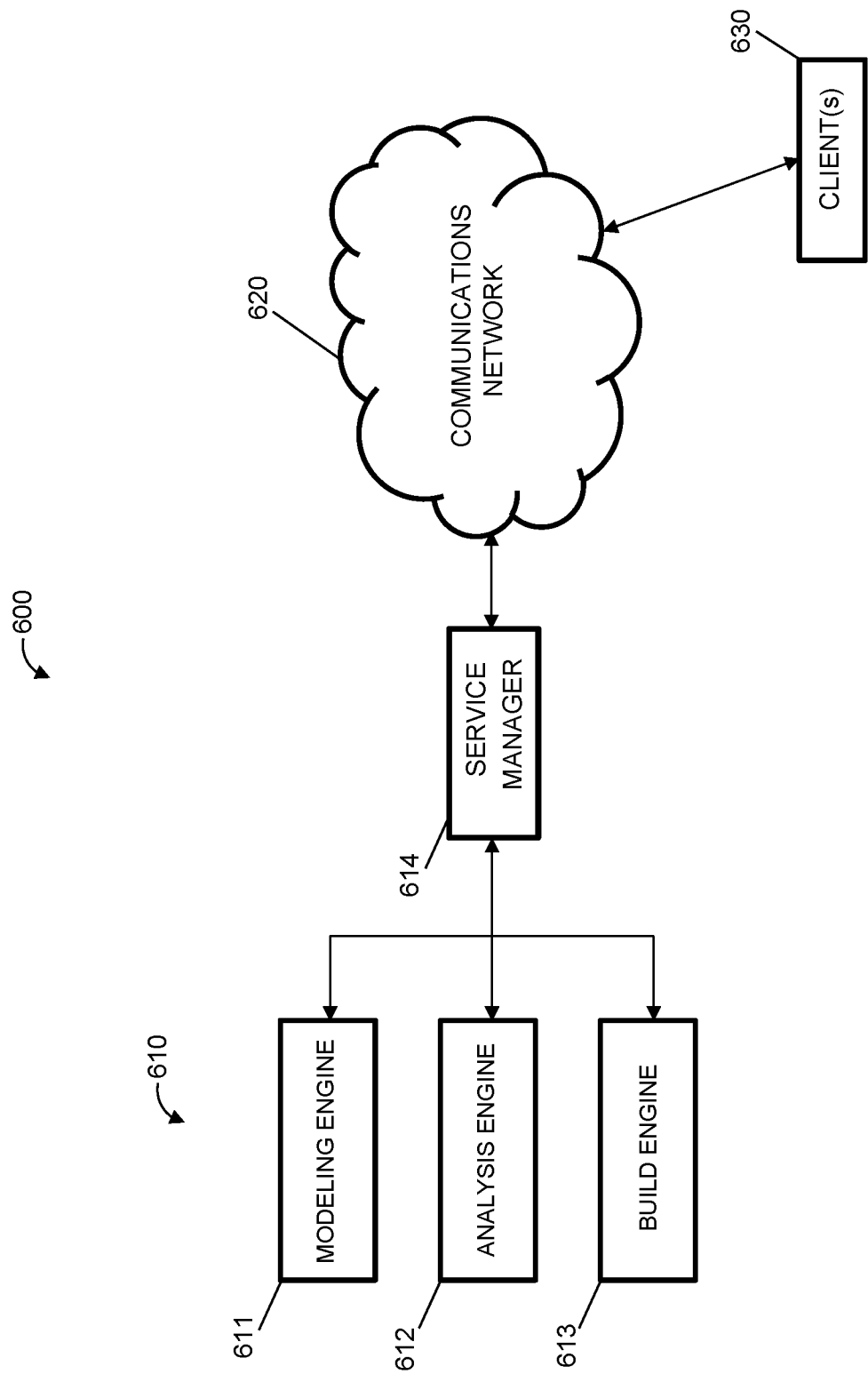
FIG. 6 illustrates a system for providing a hosted service, including modeling, analyzing and optimizing expected performance of a drilling system, according to an embodiment of the disclosure.

FIG. 6 illustrates a hosted service system 600 according to an embodiment of the disclosure. The hosted service system 600 may include a hosted service provider 610, a communications network 620 and one or more clients 630. The hosted service system 600 may include a service manager 614, a modeling engine 611, an analysis engine 612 and a build engine 613. The modeling engine 611, analysis engine 612 and build engine 613 are configured to operate in a manner consistent with the modeling engine 101, analysis engine 102 and build engine 103 described with reference to FIG. 1. In various embodiments, the service manager 614 is configured to manage service requests, receive parameters and models in connection with a service request, and provide results related to the service requests.

Figure 7:
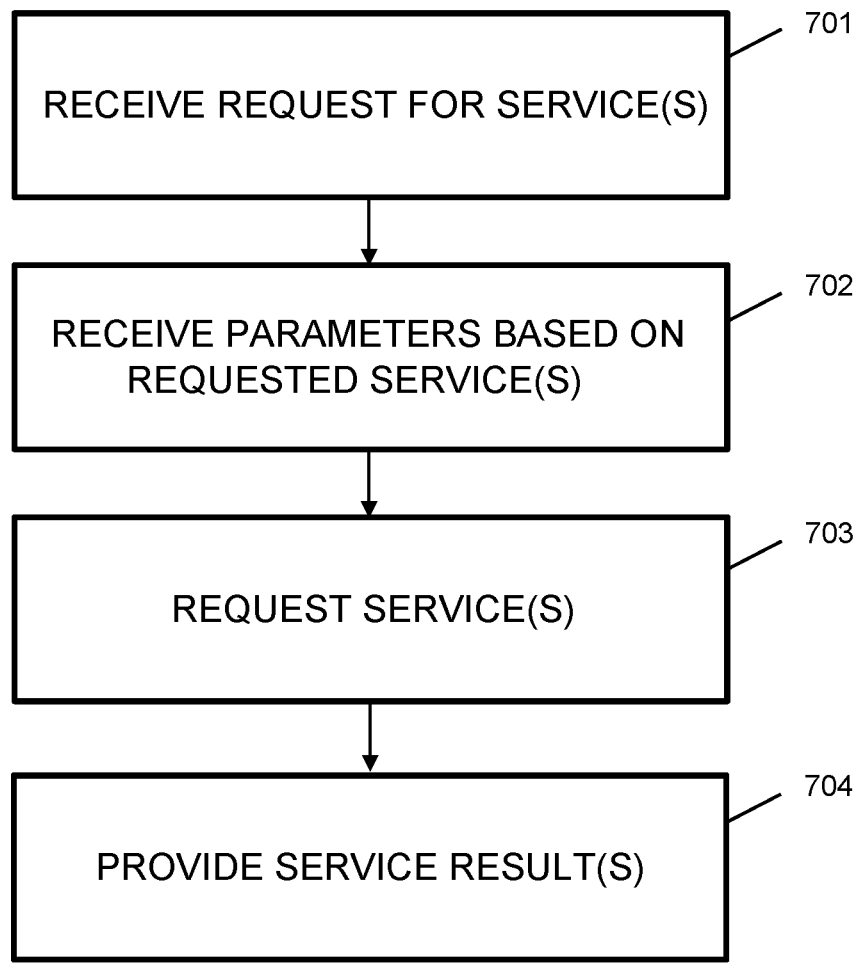
FIG. 7 is a flowchart of an operation of a system that provides a hosted service for modeling, analyzing, and optimizing expected performance of a drilling system, according to an embodiment of the disclosure.

FIG. 7 illustrates an operation of the hosted service system 600 according to an embodiment of the disclosure. A request for one or more services is received at the service manager 614 in operation 701. In various embodiments, the request is received from a client 630 at a remote terminal (e.g., a workstation). The service manager 614 receives one or more parameters for each of the services requested. In some embodiments, some or all of the parameters may be included in a request, in other embodiments the service manager 614 may request some or all of the parameters. By way of non-limiting example, for a request to model a drilling system, the parameters may relate to a particular drill bit, BHA, drill string, borehole, material, etc. By way of further non-limiting example, for a request to optimize a drilling system, the parameters may relate to a plurality of drill bits, BHAs, drill string, borehole options and material options, that are available for optimization. In addition to parameters, the service manager 614 may be configured to receive models of drilling system components. In various embodiments, the request may be related to modeling a behavior of a drilling system or optimizing a behavior of a drilling system, based on, for example, toolface severity calculations, such as those described with reference to FIGS. 4A and 4B.

The service manager 614 requests the service or services in operation 703 from one or more of the modeling engines 611, analysis engine 612 and build engine 613. The request generated by the service manager 614 may include one or more parameters and models, including, for example, those received from the client(s) 630.

The service manager 614 provides the results of the requested services in operation 704. One or more of the results may be provided to the client(s) 630 and/or provided to a third party system (not shown).

Various embodiments of the disclosure described with reference to FIGS. 1-7, above, may be implemented to facilitate user interaction via a user-interface, such as a graphical user-interface, invocable by an application program. A user-interface may be understood to mean any hardware, software, or combination of hardware and software that allows a user to interact with a computer system. For the purposes of this discussion, a user-interface will be understood to include one or more user-interface objects. User-interface objects may include display regions, user activatable regions, and the like.

A display region is a region of a user-interface that displays information to the user. A user activatable region is a region of a user-interface, such as a button or a menu, which allows the user to take some action with respect to the user-interface.

A user-interface may be invoked by an application program. When an application program invokes a user-interface, it is typically for the purpose of interacting with a user. However, it is not necessary that an actual user ever interact with the user-interface. It is also not necessary, for the purposes of this disclosure, that an interaction with the user-interface be performed by an actual user. That is to say, it is foreseen that the user-interface may have interaction with another program, such as a program created using macro programming language statements that simulate the actions of a user with respect to the user-interface.

Figure 8C:
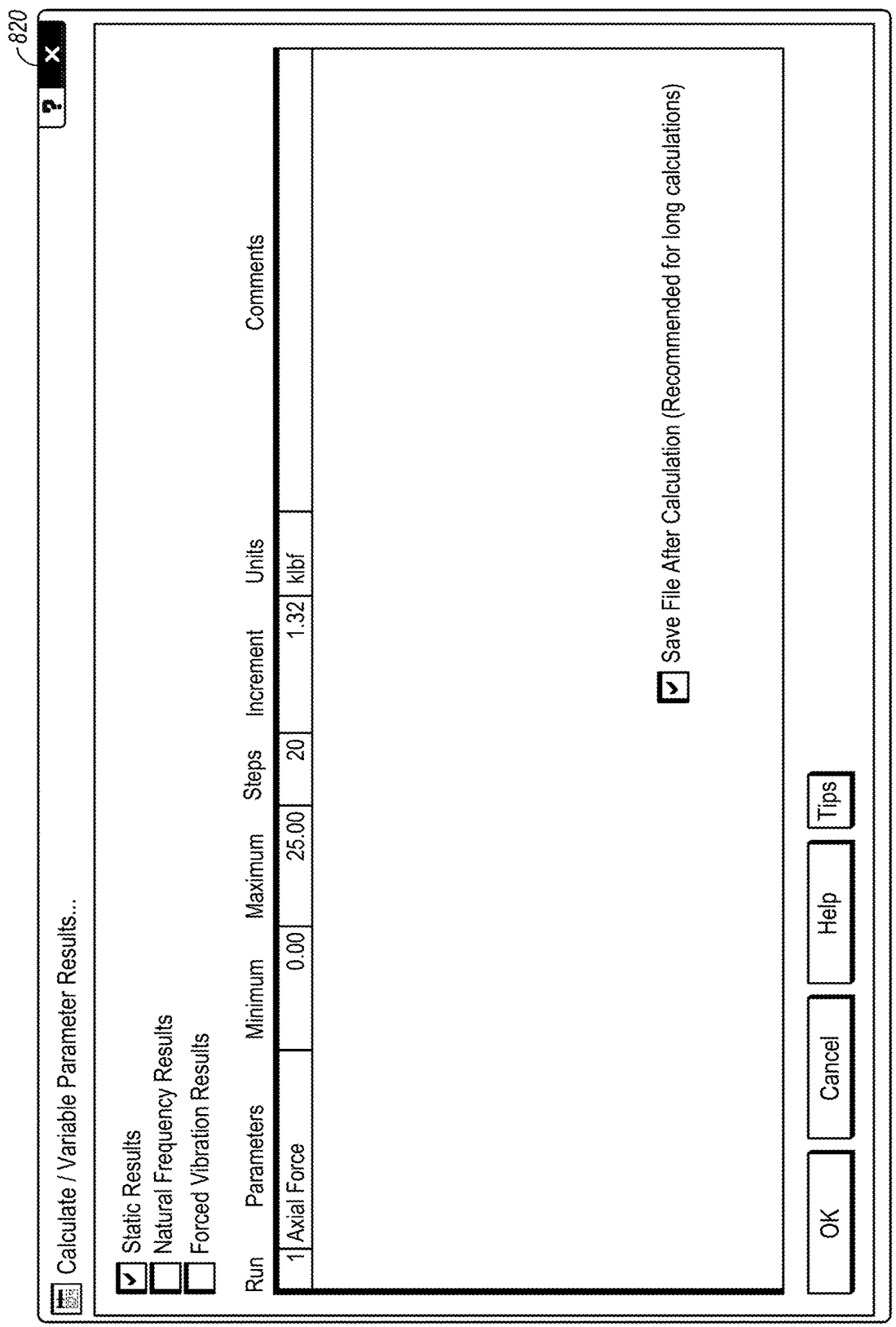

FIGS. 8A through 8C illustrate graphical user-interfaces (GUIs) 800, 810 and 820 usable in connection with the computer-aided design performed according to the various embodiments of the disclosure described herein. Each of the GUIs 800, 810 and 820 facilitate input of parameters for one or more of generating models, performing the tool severity analysis described with reference to FIGS. 4A and 4B, and performing the computer-aided analysis and design described with reference to FIGS. 5A to 5E. In one embodiment each of the GUIs 800, 810 and 820 facilitate input of values by a user. In another embodiment each of the GUIs 800, 810 and 820 facilitate importing of values from data files corresponding to, for example, models of BHA, drill string, drill bits, drill holes, boreholes, materials, etc. In yet other embodiments the GUIs 16800, 810 and 820 facilitate both importing data and directly entering the data.

Figure 9:
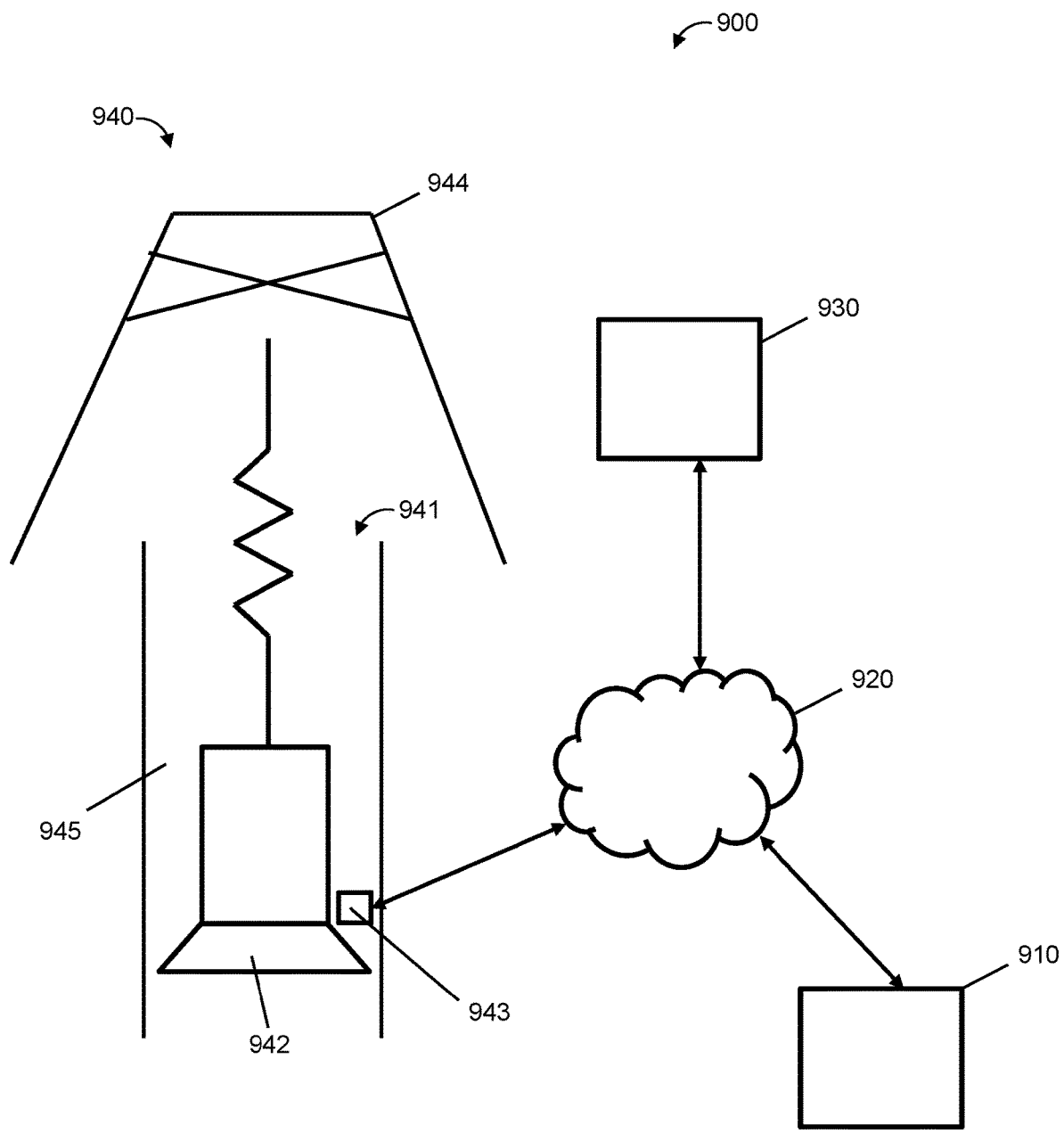
FIG. 9 illustrates a system for real-time optimization of toolface control during directional drilling of a subterranean formation.

FIG. 9 illustrates a system 900 for real-time optimization of toolface control during directional drilling of a subterranean formation, according to an embodiment of the disclosure. The system 900 includes a drilling operation 940, an operator station 930, a communications network 920, and an analysis tool 910.

The drilling operation 940 may include a drilling system 941 with a toolface 942, a borehole 945 through a subterranean formation, and a rig 944. The drilling operation 940 may further include electronics 943. The electronics 943 may be configured to measure parameters associated with the drilling operation 940 and the drilling system 941, including one or more related to toolface orientation, toolface deflection, and ROP. Embodiments of the electronics 943 may be configured to measure other parameters associated with the drilling operation 940 and drilling system 941 including torque(s) and relative torques at a bit, a BHA and drill string. The various embodiments of the electronics 943 may be configured to communicate one or more of the measurements to the analysis tool 910 and operator station 930.

The analysis tool 910 may be configured for the modeling, analysis and build functionality described with reference to the computer system 100 of FIG. 1 and FIGS. 3, 4A and 4B, including to determine toolface severity and optimize toolface control for the drilling system 941. The analysis tool 910 is configured to receive measurement data and other information about the drilling operation 940 including from the electronics 943 and the operator station 930. The analysis tool 910 is further configured to model and analyze the toolface control of the drilling system 941, and generate one or more assembly options. In one embodiment, the analysis tool 910 has one or more models and parameters for available components of a drilling system 941, including drill bits, BHAs, and drill strings. The analysis performed by the analysis tool 910 may be initiated automatically or manually at the operator station 930. In one embodiment, the analysis tool 910 is configured to generate and provide design options to optimize toolface control if one or more measurements received from the electronics 943 indicate that the drilling system 941 is not operating within acceptable parameters.

Embodiments of the operator station 930 may include a control apparatus (not shown) for the drilling operation 940, including for the drilling system 941. The operator station 930 may include various monitoring equipment (not shown) configured to communicate with one or more external devices, including the electronics 943 and the analysis tool 910 and display information related to the drilling operation 940, including information based on the information received from the electronics 943 and analysis tool 910. In one embodiment, the information displayed includes information related to the toolface control of the toolface 942. If a new design option for the drilling system 941 is received at the operator station 930, then it may be reviewed and a determination made whether to stop the drilling operation 940 and assemble a different drilling system 941 in accordance with the new design. If the determination is so made, then the drilling operation 940 is stopped, a different drilling system 941 is assembled based on the design provided by the analysis tool 910, the different drilling system 941 is installed, and the drilling operation 940 is resumed. In this manner, a drilling system may be used that optimizes toolface control for a drilling operation in real time.

Although each operation illustrated by or in connection with FIGS. 3, 4A, 4B, and 7, and the accompanying text recites acts performed in a particular order, embodiments of the present disclosure do not necessarily need to operate in that recited order. One of ordinary skill in the art would recognize many variations, including performing acts in parallel, or in a different order.

The embodiments of the disclosure described above and illustrated in the accompanying drawing figures do not limit the scope of the present disclosure, since these embodiments are merely examples of embodiments of the disclosure. The present disclosure is encompassed by the appended claims and their legal equivalents. Any equivalent embodiments lie within the scope of this disclosure. Indeed, various modifications of the present disclosure, in addition to those shown and described herein, such as other combinations and modifications of the elements described will become apparent to those of ordinary skill in the art from the description. Such embodiments, combinations, and modifications also fall within the scope of the appended claims and their legal equivalents.

What is claimed is:

1. A computer-implemented method of designing a drilling system having a bottom-hole assembly (BHA) and drill string, the method comprising:
providing a model that is indicative of: (i) one or more frictional forces at one or more contact points of the BHA and a wall of a non-linear borehole through a subterranean formation, (ii) one or more internal torques of the BHA between the one or more contact points, and (iii) one or more internal torques of the drill string between the one or more contact points;
determining, based on the model, a toolface severity for a drilling system, the toolface severity corresponding to a change in angular deflection for a change in applied weight-on-bit (WOB) of the BHA; and
selecting a design for the drilling system based on a comparison of the toolface severity to another toolface severity for a different design.

2. The method of claim 1, further comprising: assembling the drilling system based on the selected design.

3. The method of claim 1, further comprising: determining an effective drill string length.

4. The method of claim 3, wherein determining an effective drill string length comprises identifying a first section of the drill string that has a torsion and a second section of the drill string that does not have a torsion.

5. The method of claim 1, further comprising:
providing a first parameter corresponding to a first drill bit;
providing a second parameter corresponding to a second drill bit different than the first drill bit; and
optimally selecting the first drill bit or the second drill bit based on the first parameter and the second parameter.

6. The method of claim 5, wherein optimally selecting comprises selecting the first drill bit or the second drill bit based on an expected toolface control.

7. The method of claim 5, wherein optimally selecting comprises determining a first toolface severity corresponding to the first bit and a second toolface severity corresponding to the second bit, the first toolface severity and the second toolface severity based on common WOB, torque and aggressiveness of the first bit and of the second bit.

8. A method of directional drilling through a subterranean formation, the method comprising drilling with drilling system having a bottom-hole assembly (BHA) optimized to reduce fluctuations in toolface orientation along a non-linear borehole based on one or more predictions for a rate of penetration, a weight-on-bit, and an angular deflection.

9. The method of claim 7, wherein the drilling system is a bent-motor drilling system.

10. The method of claim 7, wherein the BHA comprises a drill bit.

11. The method of claim 10, wherein the drill bit is one of a fixed cutting element bit, a roller bit, a hybrid bit, and a polycrystalline diamond bit.

12. A computer program product for enabling a computer to assist with designing a drilling system, the program product comprising:
a non-transitory computer-readable medium; and
instructions on the medium that are adapted to enable the computer to perform an operation of:
provide a model that is indicative of: (i) one or more frictional forces at one or more contact points of a BHA and a wall of a non-linear borehole through a subterranean formation, (ii) one or more internal torques of the BHA between the one or more contact points, and (iii) one or more internal torques of the drill string between the one or more contact points;
determine, based on the model, a toolface severity for the drilling system, the toolface severity corresponding to a change in angular deflection for a change in applied weight-on-bit (WOB) of the BHA; and select a design for the drilling system based on a comparison of the toolface severity to another toolface severity for a different design.

13. The computer program product of claim 12, wherein the design for the drilling system comprises one or more of a design for the BHA, drill string, and drill bit.

14. The computer program product of claim 12, wherein the instructions on the medium are further adapted to enable the computer to perform the operations of determining an effective drill string length.

15. The computer program product of claim 14, wherein determining an effective drill string length comprises identifying a first section of the drill string that has a torsion and a second section of the drill string that does not have a torsion.

16. The computer program product of claim 12, wherein the instructions on the medium are further adapted to enable the computer to perform the operations of:
provide a first parameter corresponding to a first drill bit;
providing a second parameter corresponding to a second drill bit different than the first drill bit; and
optimally selecting the first drill bit or the second drill bit based on the first parameter and the second parameter.

17. The computer program product of claim 16, wherein optimally selecting comprises selecting the first drill bit or the second drill bit based on an expected toolface control of the first drill bit and an expected toolface control of the second drill bit.

18. The computer program product of claim 16, wherein optimally selecting comprises determining a first toolface severity corresponding to the first drill bit and a second toolface severity corresponding to the second drill bit, the first toolface severity and the second toolface severity based on at least a common WOB, torque and aggressiveness of the first drill bit and of the second drill bit.

19. A system for enabling toolface control while drilling a borehole through subterranean formation, the system comprising:
a computer model indicative of differences in toolface control for a plurality of drill bits; and
a drilling system including a first drill bit that according to the computer model has a higher toolface control than at least one other drill bit of the plurality of drill bits.

20. The system of claim 19, further comprising:
a monitoring device for determining a measure of an angular deflection of a toolface of the drilling system along at least part of the borehole through the subterranean formation; and
a processing module configured to determine a second drill bit that according to the computer model has a higher toolface control than the measure of the angular deflection.

* * * * *

UNITED STATES PATENT AND TRADEMARK OFFICE
CERTIFICATE OF CORRECTION

PATENT NO. : 10,519,752 B2
APPLICATION NO. : 15/629378
DATED : December 31, 2019
INVENTOR(S) : Reed W. Spencer Page 1 of 1

It is certified that error appears in the above-identified patent and that said Letters Patent is hereby corrected as shown below:

In the Specification
Column 7, Line 12, change "for each the section" to --for each section--

Signed and Sealed this
Fourth Day of February, 2020

Andrei Iancu
*Director of the United States Patent and Trademark Office*